(12) United States Patent
Kwon

(10) Patent No.: US 11,714,424 B2
(45) Date of Patent: Aug. 1, 2023

(54) DATA AUGMENTATION USING COMPUTER SIMULATED OBJECTS FOR AUTONOMOUS CONTROL SYSTEMS

(71) Applicant: Phantom AI, Inc., Burlingame, CA (US)

(72) Inventor: Youngwook Paul Kwon, Burlingame, CA (US)

(73) Assignee: Phantom AI, Inc., Mountain View, CA (US)

( * ) Notice: Subject to any disclaimer, the term of this patent is extended or adjusted under 35 U.S.C. 154(b) by 0 days.

(21) Appl. No.: 17/470,356

(22) Filed: Sep. 9, 2021

(65) Prior Publication Data

US 2021/0405648 A1 Dec. 30, 2021

Related U.S. Application Data

(62) Division of application No. 16/358,168, filed on Mar. 19, 2019, now Pat. No. 11,144,065.

(60) Provisional application No. 62/645,706, filed on Mar. 20, 2018.

(51) Int. Cl.
  *G05D 1/02* (2020.01)
  *G06N 20/00* (2019.01)
  *G05D 1/00* (2006.01)
  *G06F 30/20* (2020.01)

(52) U.S. Cl.
  CPC ......... *G05D 1/0251* (2013.01); *G05D 1/0088* (2013.01); *G06F 30/20* (2020.01); *G06N 20/00* (2019.01); *G05D 2201/0213* (2013.01)

(58) Field of Classification Search
  CPC .................................................. G05D 1/0251
  See application file for complete search history.

(56) References Cited

U.S. PATENT DOCUMENTS

| 10,692,050 B2 | 6/2020 | Taliwal et al. | |
| 10,990,832 B2 * | 4/2021 | Kwon | G06V 20/588 |
| 11,144,065 B2 * | 10/2021 | Kwon | G05D 1/0088 |
| 11,210,533 B1 * | 12/2021 | Cha | G06V 20/58 |
| 2017/0293894 A1 | 10/2017 | Taliwal et al. | |

OTHER PUBLICATIONS

PCT International Search Report and Written Opinion, PCT Application No. PCT/US19/22961, dated Jul. 17, 2019, 16 pages.
United States Office Action, U.S. Appl. No. 16/358,168, dated Mar. 15, 2021, seven pages.

* cited by examiner

*Primary Examiner* — Michael A Berns
(74) *Attorney, Agent, or Firm* — Fenwick & West LLP

(57) ABSTRACT

A modeling system trains computer models for an autonomous control system using computer simulated models of objects. The objects may be vehicles, and the computer simulated models may be virtual models of vehicles simulated by computer software. Since the vehicle models are computer simulated, various characteristics of the vehicle can be easily obtained by the modeling system. The various types of data may include geometric information of the vehicle, views of the vehicle from different perspectives, and the like. The modeling system can easily generate and label a large amount of training data using the characteristics of the computer simulated vehicles. The modeling system can use the training data to train computer models for the autonomous control system.

18 Claims, 10 Drawing Sheets

DATA AUGMENTATION USING COMPUTER SIMULATED OBJECTS FOR AUTONOMOUS CONTROL SYSTEMS

CROSS-REFERENCE TO RELATED APPLICATIONS

This application is a divisional application of U.S. patent application Ser. No. 16/358,168, filed on Mar. 19, 2019, which claims the benefit under 35 U.S.C. § 119(e) to U.S. Provisional Patent Application No. 62/645,706, filed on Mar. 20, 2018, each of which is hereby incorporated by reference in their entirety.

BACKGROUND

This invention relates generally to autonomous control systems for vehicles, and more particularly to autonomous control systems for vehicles using machine-learned models trained with computer-aided design (CAD) models.

Autonomous control systems are systems that guide vehicles (e.g., automobiles, trucks, vans) without direct guidance by human operators. Autonomous control systems analyze the surrounding physical environment in various ways to guide vehicles in a safe manner. For example, an autonomous control system may detect an object in the middle of the road. Responsive to the detection, the autonomous control system may guide the vehicle away from the object such that collision with the object can be avoided. As another example, an autonomous control system may detect lanes on the road such that the vehicle can be guided within the appropriate lane of traffic.

Often times, the autonomous control system uses various types of machine-learned computer models to analyze the surrounding environment. The computer models are configured to receive an input and generate a desired output that provides useful information on the surrounding environment to the autonomous control system. For example, an object detection model may be configured to receive an image of the environment and output the image in which objects-of-interest, such as pedestrians and trees, are delineated with bounding boxes. The autonomous control system may use the object detection model to detect objects on the road while the vehicle is being operated.

The computer models are typically constructed with training data that include multiple instances of input data and corresponding output data for which the desired information is already known. For example, the object detection model may be trained using multiple images of environments and annotated versions of the images in which locations of the objects-of-interests are already known and annotated with bounding boxes. However, obtaining training data may require a significant amount of resources, especially if human operators are needed to label or annotate different types of data. For example, training data for the object detection model may require human operators to annotate each bounding box in the image, which may require a significant amount of time.

SUMMARY

A modeling system trains computer models for an autonomous control system using computer simulated models of objects. In one particular embodiment, the objects are vehicles, and the computer simulated models are virtual models of vehicles simulated by computer software. Since the vehicle models are computer simulated, various characteristics of the vehicle can be easily obtained by the modeling system. The various types of data may include geometric information of the vehicle, views of the vehicle from different perspectives, and the like. The modeling system can easily generate and label a large amount of training data using the characteristics of modeled vehicles. The modeling system can use the training data to train computer models for the autonomous control system.

In one embodiment, the modeling system trains an object detection model configured to receive an image containing an object-of-interest and output metadata for the object in the image. The objects may be vehicles. The metadata may include, among other things, coordinates for a 3-D bounding box around the vehicle, orientation of the vehicle, and type of the vehicle. During deployment, the autonomous control system for an operating vehicle can identify vehicles in a scene and obtain metadata for the vehicles by applying the object detection model to the images of the vehicles. The autonomous control system can provide improved autonomous guidance based on the metadata obtained from the object detection model.

The modeling system trains the object detection model using a training data set of computer simulated vehicles. Specifically, the training data includes images of a set of computer simulated vehicles and known metadata for the set of computer simulated vehicles. For example, the training data may include images of a set of CAD generated vehicle models and known metadata of the CAD vehicle models. The modeling system may automatically obtain the metadata of the computer simulated vehicles from the simulation files themselves, without the need for a human operator to label the data. For example, the modeling system may automatically determine coordinates for a 3-D bounding box of a CAD vehicle based on geometric information obtained from the CAD file of the vehicle.

The modeling system trains a set of parameters of the object detection model from the training data that contribute to prediction of the desired metadata given an image. During the training process, the modeling system repeatedly updates a set of parameters for the object detection model to reduce a loss function. The loss function indicates a difference between the known metadata and estimated metadata generated by applying the object detection model to the images of the computer simulated models in the training data. Although the object detection model is trained based on a data set of simulated data, the model is able to receive images of actual vehicles in an environment and identify the metadata with good accuracy because the computer simulated vehicles significantly resemble the actual vehicles themselves.

In one embodiment, the modeling system trains a transformation model configured to receive a reference image of an object taken from a reference viewpoint and output a predicted target image that predicts the appearance of the object from a target viewpoint. The objects may be vehicles. For example, the transformation model may receive an image of the side part of a vehicle and output an image that predicts the appearance of the back of the vehicle. During deployment, the autonomous control system transforms reference images of vehicles to predicted target images by applying the transformation model to the reference images. The autonomous control system can provide improved vehicle detection based on the predicted target images generated by the transformation model.

The modeling system trains the transformation model using a training data set of images. Specifically, the training dataset includes a set of reference images that are images of the computer simulated vehicles if a virtual sensor were present to capture the simulated vehicle from a reference viewpoint. The training data also includes a set of target images that are images of the computer simulated models if a virtual sensor were present to capture the simulated vehicle from a target viewpoint. By using computer simulated vehicles, the modeling system can easily obtain a large amount of training data without the need to identify images of actual vehicles taken from the reference and target viewpoints.

The modeling system trains a set of parameters of the transformation model from the training data that contribute to prediction of the target image of the vehicle given a reference image of the vehicle. During the training process, the modeling system repeatedly updates a set of parameters for the transformation model to reduce a loss function. The loss function indicates a difference between the set of target images and predicted target images generated by applying the transformation model to the set of reference images. Similarly to the object detection model, although the transformation model is trained based on computer simulated vehicles, the model is able to receive reference images of actual vehicles in the environment and generate predicted target images of the vehicles with good accuracy because the computer simulated vehicles significantly resemble the actual vehicles themselves.

Embodiments relate to a computer-implemented method for training a machine-learned transformation model configured to receive an image of a vehicle from a reference viewpoint and output a target image of the vehicle from a target viewpoint different from the reference viewpoint. An embodiment of the method comprises obtaining a training dataset of images that represent a set of computer simulated vehicles with a known set of characteristics. The training dataset includes a training set of reference images that capture the computer simulated vehicles from one or more reference viewpoints and a corresponding training set of target images that capture the computer simulated vehicles from one or more target viewpoints different from the one or more reference viewpoints. The method comprises training a set of parameters of the transformation model using the training dataset of images. The training comprises repeatedly performing the iterations of generating a set of estimated target images by applying the transformation model with an estimated set of parameters to the training set of reference images, determining a loss function indicating a difference between the set of estimated target images and the training set of target images, and updating the set of parameters of the transformation model to reduce the loss function.

Embodiments also relate to a computer-implemented method for training an object detection model configured to receive an image of a vehicle and output a set of 3-D bounding box coordinates of the vehicle in the image. An embodiment of the method comprises obtaining a training dataset of images that represent a set of computer simulated vehicles with a known set of characteristics. The characteristics include geometric information of the vehicles in the images. The method comprises obtaining a training set of coordinates for the images that represent 3-D bounding boxes of the computer simulated vehicles. The 3-D bounding boxes enclose an outer boundary of the computer simulated vehicles, and the training set of coordinates for the 3-D bounding boxes are determined based on the geometric information of the computer simulated vehicles. The method further comprises training a set of parameters of the object detection model using the training dataset of images. The training comprises repeatedly performing iterations of generating a set of estimated coordinates by applying the object detection model with an estimated set of parameters to the training dataset of images, determining a loss function indicating a difference between the set of estimated coordinates and the training set of coordinates for the computer simulated vehicles, and updating the set of parameters of the object detection model to reduce the loss function.

Embodiments also relate to a non-transitory computer-readable medium storing executable computer program instructions for training a machine-learned transformation model configured to receive an image of a vehicle from a reference viewpoint and output a target image of the vehicle from a target viewpoint different from the reference viewpoint. An embodiment of the computer program instructions comprise obtaining a training dataset of images that represent a set of computer simulated vehicles with a known set of characteristics. The training dataset includes a training set of reference images that capture the computer simulated vehicles from one or more reference viewpoints and a corresponding training set of target images that capture the computer simulated vehicles from one or more target viewpoints different from the one or more reference viewpoints. The instructions further comprise training a set of parameters of the transformation model using the training dataset of images. The training comprises repeatedly performing the iterations of generating a set of estimated target images by applying the transformation model with an estimated set of parameters to the training set of reference images, determining a loss function indicating a difference between the set of estimated target images and the training set of target images, and updating the set of parameters of the transformation model to reduce the loss function.

Embodiments also relate to a non-transitory computer-readable medium storing executable computer program instructions for training an object detection model configured to receive an image of a vehicle and output a set of 3-D bounding box coordinates of the vehicle in the image. An embodiment of the computer program instructions comprises obtaining a training dataset of images that represent a set of computer simulated vehicles with a known set of characteristics. The characteristics include geometric information of the vehicles in the images. The instructions further comprise obtaining a training set of coordinates for the images that represent 3-D bounding boxes of the computer simulated vehicles. The 3-D bounding boxes enclose an outer boundary of the computer simulated vehicles, and the training set of coordinates for the 3-D bounding boxes are determined based on the geometric information of the computer simulated vehicles. The instructions further comprise training a set of parameters of the object detection model using the training dataset of images. The training comprises repeatedly performing iterations of generating a set of estimated coordinates by applying the object detection model with an estimated set of parameters to the training dataset of images, determining a loss function indicating a difference between the set of estimated coordinates and the training set of coordinates for the computer simulated vehicles, and updating the set of parameters of the object detection model to reduce the loss function.

Embodiments also relate to an autonomous control vehicle including a machine-learned transformation model stored on a computer-readable medium. An embodiment of the transformation model is manufactured by the process of obtaining a training dataset of images that represent a set of computer simulated vehicles with a known set of characteristics. The training dataset includes a training set of reference images that capture the computer simulated vehicles from one or more reference viewpoints and a corresponding training set of target images that capture the computer simulated vehicles from one or more target viewpoints different from the one or more reference viewpoints. The transformation model is also manufactured by training a set of parameters of the transformation model using the training dataset of images. The training comprises repeatedly performing the iterations of generating a set of estimated target images by applying the transformation model with an estimated set of parameters to the training set of reference images, determining a loss function indicating a difference between the set of estimated target images and the training set of target images, and updating the set of parameters of the transformation model to reduce the loss function.

Embodiments also relate to an autonomous control vehicle including a machine-learned object detection model stored on a computer-readable medium. An embodiment of the object detection model is manufactured by the process of obtaining a training dataset of images that represent a set of computer simulated vehicles with a known set of characteristics. The characteristics include geometric information of the vehicles in the images. The object detection model is also manufactured by obtaining a training set of coordinates for the images that represent 3-D bounding boxes of the computer simulated vehicles. The 3-D bounding boxes enclose an outer boundary of the computer simulated vehicles, and the training set of coordinates for the 3-D bounding boxes are determined based on the geometric information of the computer simulated vehicles. The object detection model is further manufactured by training a set of parameters of the object detection model using the training dataset of images. The training comprises repeatedly performing iterations of generating a set of estimated coordinates by applying the object detection model with an estimated set of parameters to the training dataset of images, determining a loss function indicating a difference between the set of estimated coordinates and the training set of coordinates for the computer simulated vehicles, and updating the set of parameters of the object detection model to reduce the loss function.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

Figure 1A:
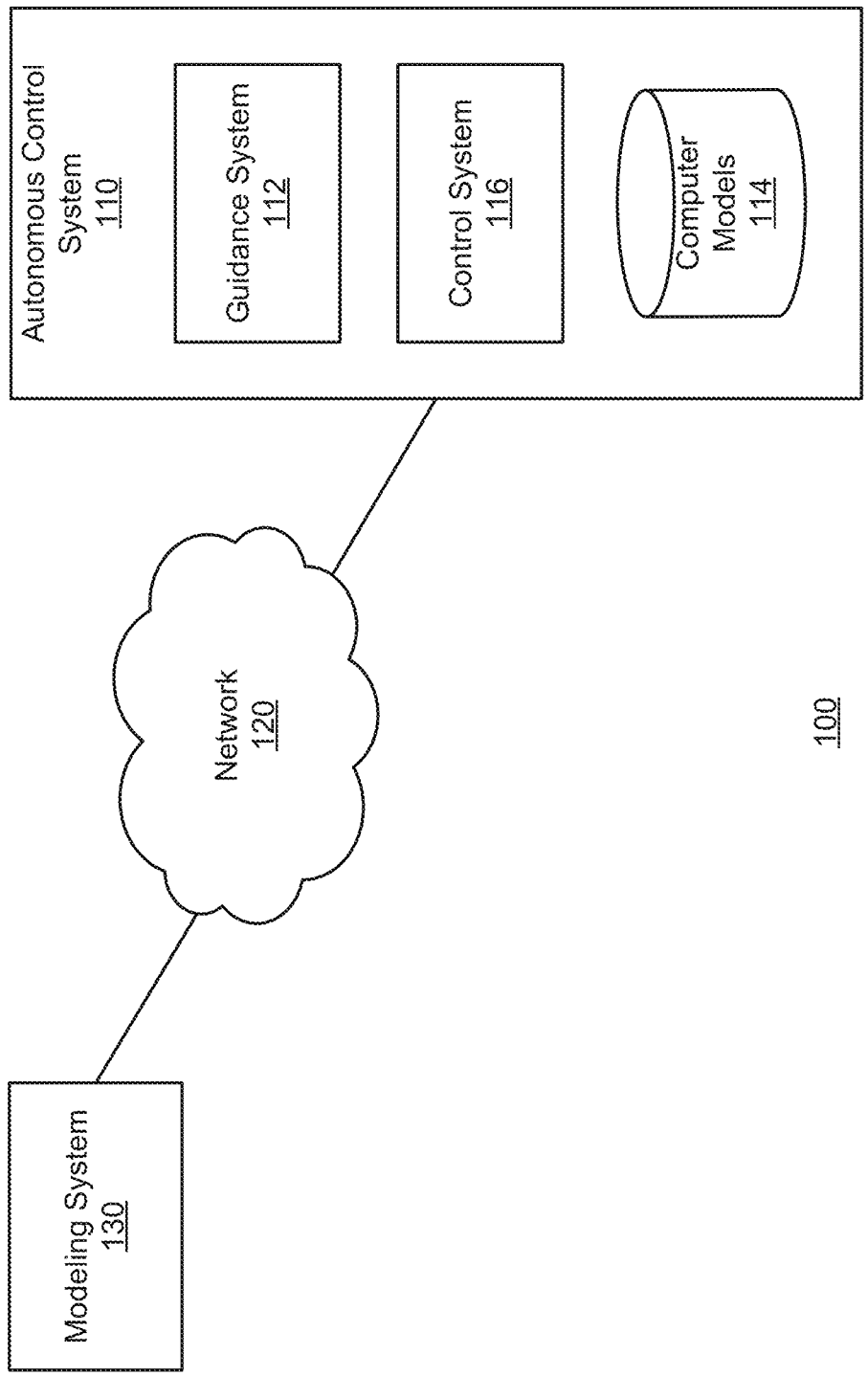
FIG. 1A is an example network environment for autonomous control, in accordance with an embodiment.

FIG. 1A is an example network environment 100 for autonomous control, in accordance with an embodiment. The network environment 100 includes an autonomous control system 110 and a modeling system 130 coupled to a network 120.

The autonomous control system 110 is a system that guides vehicles such as automobiles, trucks, and vans without direct guidance by human operators. The autonomous control system 110 may be installed on a vehicle. The autonomous control system 110 analyzes the surrounding physical environment in various ways to guide the vehicles in a safe manner. For example, the autonomous control system 110 may detect an object in the middle of the road. Responsive to the detection, the autonomous control system 110 may guide the vehicle away from the object such that collision with the object can be avoided. As another example, the autonomous control system 110 may detect lanes on the road such that the vehicle can be guided within the appropriate lane of traffic. In one embodiment, the autonomous control system 110 uses various types of computer models to analyze the surrounding environment.

Specifically, the autonomous control system 110 includes a guidance system 112, a control system 116, and a database of computer models 114. The guidance system 112 obtains an image of a scene, typically from a frontal view of the operating vehicle, and applies the computer models 114 to the image of the scene to generate outputs that provide information on the surrounding environment. The image of the scene may be captured by various sensors on the vehicle of the autonomous control system 110, and may be an RGB image captured by a camera, a 3-D LIDAR image captured by a LIDAR sensor, a RADAR image captured by a RADAR sensor, and the like.

The computer models 114 are trained and provided by the modeling system 130. In one embodiment, one or more of the computer models 114 are trained using computer simulated models of objects that are virtual models of objects simulated by computer software. The guidance system 112 uses the output of the computer models 114 to provide guidance to the operating vehicle.

In one embodiment, the computer models 114 include an object identification model configured to receive an image of a scene and identify regions-of-interest in the scene that contain particular types of objects. Specifically, the guidance system 112 may identify candidate regions in the scene and apply the object identification model to identify regions-of-interest that contain vehicles. The candidate regions may be windows of pixels in the scene, and the object identification model may be applied to multiple regions in a sliding window manner to detect regions in the scene that contain vehicles.

In one embodiment, the computer models 114 include an object detection model configured to receive an image x containing an object-of-interest and output metadata m for the object in the image. In one particular embodiment referred throughout the specification, the objects-of-interest are vehicles in the scene. However, it is appreciated that in other embodiments, the objects-of-interest may be objects other than vehicles, such as pedestrians, trees, and the like.

The image x may represent a matrix or vector of addressable elements in the image, such as intensities of pixel values of the image.

The metadata m may include, among other things, coordinates of a 3-D bounding box around the object that enclose the outer boundaries of the object. The metadata m may also include an orientation of the object. For example, the orientation of a vehicle may be defined with respect to an angular displacement from a reference axis along the length of the vehicle. The metadata m may also include a type of object when the object can be classified into one or more categories. For example, the type of vehicle may be defined as one out of multiple categories that classify vehicles with respect to their structure and/or functions.

During deployment, the guidance system 112 may identify vehicles in a scene and obtain metadata for the vehicles by applying the object detection model to images of vehicles. Specifically, the guidance system 112 obtains regions-of-interest in the scene that are identified to contain vehicles. The regions-of-interest may be identified through the object identification model. The guidance system 112 generates metadata m for the identified vehicles by applying the object detection model to the region-of-interest x. The guidance system 112 may use the predicted metadata to provide guidance to the operating vehicle.

In one instance, the guidance system 112 uses a mapping system to transform an image of the scene from a frontal view of the operating vehicle to a bird's-eye view. The bird's-eye view maps the environment to a top perspective and enables the guidance system 112 to determine the actual curvature of roads, lanes, and the like. The 3-D bounding boxes are also transformed to a bird's-eye view as if the identified vehicle was viewed from a top perspective, and may be used to more accurately determine dimensions and orientations of the identified vehicle in the scene.

Figure 2:
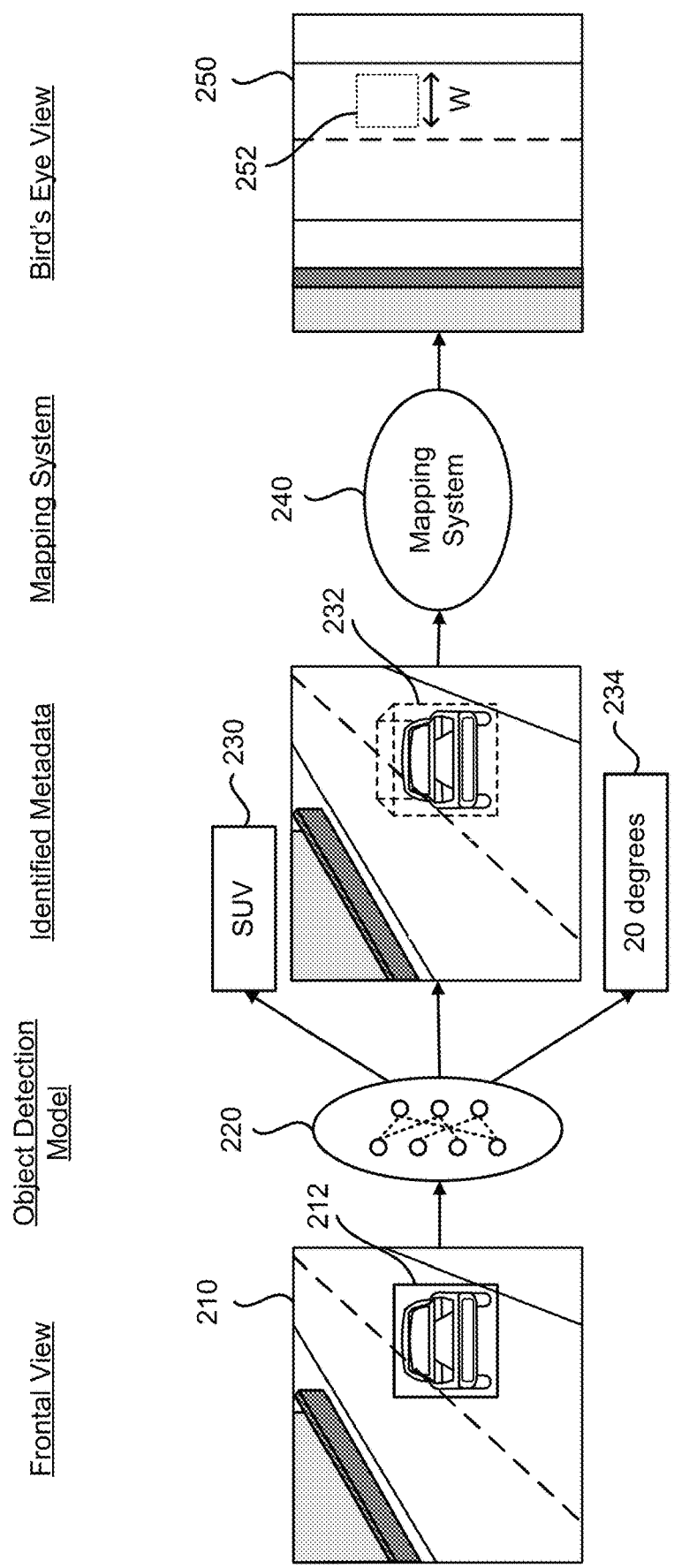
FIG. 2 is an example process of deploying the object detection model, according to one embodiment.

FIG. 2 is an example process of deploying the object detection model, according to one embodiment. The guidance system 112 obtains an image 210 of the environment surrounding the operating vehicle from a frontal view. In the example shown in FIG. 2, the image 210 contains a vehicle on the road. The guidance system 112 obtains a region-of-interest 212 of the image containing the vehicle. The metadata for the vehicle is generated by applying an object detection model 220 to the region of pixels 212. Among others, the metadata includes the vehicle type 230 "SUV," coordinates for a 3-D bounding box 232 around the vehicle, and the orientation 234 of the vehicle "20 degrees" defined, for example, as the angular displacement of the vehicle with respect to an axis along the length of the vehicle.

The guidance system 112 converts the image 210 from a frontal view to an image 250 from a bird's-eye view using a mapping system 240. The image 250 from a bird's-eye view of the scene shows the road and the identified vehicle from a top perspective. The 3-D bounding box 232 is also transformed into a bird's-eye view to generate coordinates for a transformed bounding box 252 that outlines the vehicle as if the vehicle was viewed from a top perspective. In the example of FIG. 2, the guidance system 112 estimates the back part of the vehicle to have width W, as obtained from the transformed bounding box 252. The guidance system 112 may take the estimated width of the identified vehicle into consideration when providing guidance on how the operating vehicle is steered on the road.

Returning to FIG. 1A, in one embodiment, the computer models 114 also include a transformation model configured to receive a reference image r of an object taken from a reference viewpoint and output a predicted target image t of the object that predicts the appearance of the object from a target viewpoint. In one particular embodiment referred throughout the specification, the objects are vehicles in the scene. For example, the transformation model may receive an image of the side part of a vehicle and output an image that predicts the appearance of the back part of the vehicle. However, it is appreciated that in other embodiments, the objects may be objects other than vehicles, such as pedestrians, trees, and the like.

During deployment, the guidance system 112 transforms reference images of vehicles to predicted target images by applying the transformation model to the reference images. In one instance, the guidance system 112 uses the transformation model to improve vehicle detection capabilities for the autonomous control system 110. Specifically, the object identification model may detect vehicles with limited accuracy when vehicles are shown from a particular set of perspectives in the scene, because, for example, the object model was not extensively trained to detect these viewpoints. For example, the object identification model may detect vehicles with limited accuracy when only the side views of vehicles are shown in the image of the scene.

Using the transformation model, the guidance system 112 can generate images predicting the appearances of vehicles from a target viewpoint from images of vehicles taken from the reference viewpoint. The guidance system 112 can then perform vehicle detection using the predicted target images with improved accuracy. Specifically, the guidance system 112 obtains regions of the scene that may potentially contain a vehicle. For each region, the guidance system 112 generates a predicted target image by applying the transformation model to the region of the scene. Due to this transformation for example, regions-of-interest that contain the side view of vehicles may be transformed to images predicting the appearance of rear views of the vehicles. The guidance system 112 applies an object identification model to the predicted target images to detect vehicles with improved accuracy.

In one embodiment, the transformation model is configured to receive the reference image r of an object and also a label/indicating a desired target viewpoint. The transformation model is configured to output a predicted target image t of the object that predicts the appearance of the object from the desired target viewpoint as specified in the label/at the input. For example, the label containing the target viewpoint can be represented as coordinates of a virtual camera if the virtual camera were to capture the vehicle from the target viewpoint in a reference coordinate system. Distinct from the previous embodiment, the transformation model is capable of generating a wider range of target images according to the desired viewpoint indicated in the label/during deployment.

Figure 3:
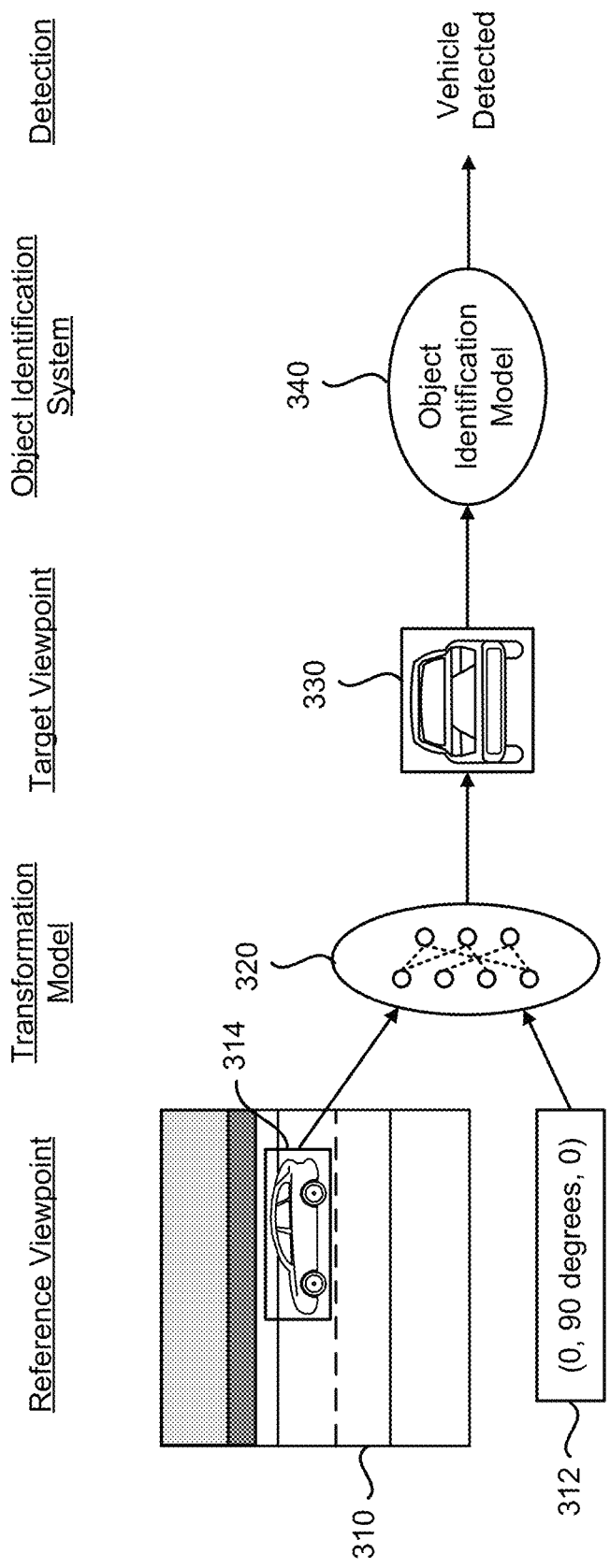
FIG. 3 is an example process of deploying a transformation model, according to an embodiment.

FIG. 3 is an example process of deploying a transformation model, according to an embodiment. The transformation model 320 shown in FIG. 3 is configured to receive a reference image showing a side view of a vehicle and also a label indicating a desired target viewpoint.

The guidance system 112 obtains an image 310 of the environment surrounding the operating vehicle. The guidance system 112 also specifies a label 312 indicating the desired target viewpoint. In the example shown in FIG. 3, the target viewpoint is represented as coordinates (0, 90 degrees, 0), which indicates a rear view of the vehicle when the reference viewpoint is a side view of the vehicle. In addition to other candidate regions in the image 310, the guidance system 112 applies the transformation model 320 to a region 314 of the image containing a side view of a vehicle. The output of the transformation model 320 is a predicted target image 330 containing a prediction of the rear view of the vehicle. The guidance system 112 determines that a vehicle is present at the location of the region 314 by applying an object identification model 340 to the predicted target image 330. The guidance system 112 may use the detection information when providing guidance to the vehicle during operation.

Returning to the autonomous control system 100 shown in FIG. 1A, the control system 116 is representative of the interface between the guidance system 112 and the electrical and/or mechanical systems of the operating vehicle that allow control of the movement of the vehicle. For example, the control system 116 may represent an interface between the guidance system 112 and the steering system (e.g., steering wheel, steering rack, rack and pinion, etc.) of the vehicle. As another example, the control system 116 may also represent an interface between the guidance system 112 and the brake system (e.g., brake calipers, brake rotors, ABS sensors, ABS controller, etc.) of the vehicle. The control system 116 may receive guidance on how to steer the vehicle from the guidance system 112 and control the electrical and/or mechanical systems of the vehicle such that the vehicle operates according to the guidance.

The modeling system 130 trains computer models 114 for the autonomous control system 110. Typically, the computer models 114 are constructed with training data that include multiple instances of input data and output data for which the desired information in the output data is already known. For example, the object detection model may be trained using multiple images of objects and annotated versions of the objects in which locations of the objects are already known and annotated with 3-D bounding boxes. However, obtaining training data may require a significant amount of resources, especially if human operators are needed to label or annotate different types of data. For example, training data for the object detection model may require human operators to annotate each bounding box in the image, which may require a significant amount of time.

In one embodiment, the modeling system 130 trains computer models 114 using computer simulated models of objects that are virtual models of objects simulated by computer software. Specifically, the training data contains images of the computer simulated models that are snapshots of the models from multiple perspectives. In one particular instance referred throughout the specification, the computer simulated models are virtual models of vehicles. However, it is appreciated that in other embodiments, the computer simulated models may be virtual models of other objects that the computer models 114 are used for during deployment.

Since the training data is simulated by the computer, various characteristics of the modeled vehicles can be easily obtained by the modeling system 130 without the need for a human operator. For example, the modeling system 130 may gain access to the geometric information of the vehicle, views of the vehicle from different perspectives, and the like from the file of the computer simulated model. Thus, the modeling system 130 can generate and label a large amount of training data using the already known characteristics of the computer simulated vehicles that can be used to train one or more computer models 114.

In one embodiment, when the computer models 114 are configured to receive RGB images from a camera, the computer simulated models may be computer-aided (CAD) generated models of objects. In such an instance, the training data may contain snapshots of 2-D projected CAD vehicle models. In another instance, when the computer models 114 are configured to receive LIDAR images from a LIDAR sensor, the computer simulated models may be simulated LIDAR models of objects. In such an instance, the training data may contain snapshots of the 3-D LIDAR simulated vehicle. However, the embodiments are not limited hereto, and the training data in general may be composed of computer simulated models of objects that correspond to the type of sensor signals of those in the images received by the computer models 114.

In one embodiment, the modeling system 130 trains the object detection model using computer simulated training data. Specifically, the training data includes images for a set of computer simulated vehicles and known metadata for the set of computer simulated vehicles. The metadata includes, among other information, 3-D bounding box coordinates around the vehicle models, orientation of the vehicle models, and the like. The modeling system 130 may obtain the known metadata from the computer simulated files themselves, without the need for a human operator to label the data. For example, the modeling system 130 may automatically determine coordinates for a 3-D bounding box based on geometric information obtained from a CAD file of the vehicle model.

The modeling system 130 trains a set of parameters of the object detection model from the training data that contribute to prediction of the metadata given an image of a vehicle. During the training process, the modeling system repeatedly updates a set of parameters for the object detection model to reduce a loss function. The loss function indicates a difference between the known metadata and estimated metadata generated by applying the object detection model to the computer simulated images in the training data. Although the object detection model is trained based on a data set of computer simulated vehicles, the model is able to receive images of actual vehicles in an environment and identify the metadata with good accuracy because the computer simulated vehicles significantly resemble the actual vehicles themselves.

In one embodiment, the modeling system 130 trains the transformation model using computer simulated models of vehicles. Specifically, the training data includes a set of reference images that are images of the computer simulated vehicles if a virtual sensor were present to capture the simulated vehicle from a reference viewpoint. The training data also includes a set of target images that are images of the computer simulated models if a virtual sensor were present to capture the simulated vehicle from a target viewpoint. By using computer simulated models for training the transformation model, the modeling system 130 can easily obtain a large amount of training data without the need to identify images of actual vehicles taken from the reference and target perspectives.

The modeling system 130 trains a set of parameters of the transformation model from the training data that contribute to prediction of the target image of the vehicle given a reference image of the vehicle. During the training process, the modeling system 130 repeatedly updates a set of parameters for the transformation model to reduce a loss function. The loss function indicates a difference between target images and estimated images generated by applying the transformation model to the reference images in the training data. Similarly to the object detection model, although the transformation model is trained based on a data set of computer simulated vehicles, the model is able to receive reference images of actual vehicles in the environment and generate predicted target images of the vehicles with good accuracy because the computer simulated vehicles significantly resemble the actual vehicles themselves.

In one embodiment, when the transformation model is further configured to receive the label indicating a desired target viewpoint, the training data includes a set of reference images, a set of labels indicating target viewpoints, and a set of target images including images of the computer simulated models taken from the target viewpoints indicated in the corresponding label. During the training process, the modeling system 130 repeatedly updates a set of parameters for the transformation model to reduce a loss function. The loss function indicates a difference between target images and estimated images generated by applying the transformation model to the reference images and the labels indicating the target viewpoints.

By training the transformation model across multiple target viewpoints instead of a single target viewpoint, the set of parameters of the transformation model can learn varying degrees of transformation that may allow it to generate predicted target images for viewpoints that were not included in the training data. For example, the transformation model may be trained with target images for a first set of coordinates and a second set of coordinates. The transformation model may generate a predicted image for a third set of coordinates located between the first set and the second set of coordinates with reasonable accuracy. This is because the set of parameters for the transformation model have learned a general relationship between the target viewpoints and the required transformations to generate the corresponding target images through the range of target images in the training dataset.

Figure 1B:
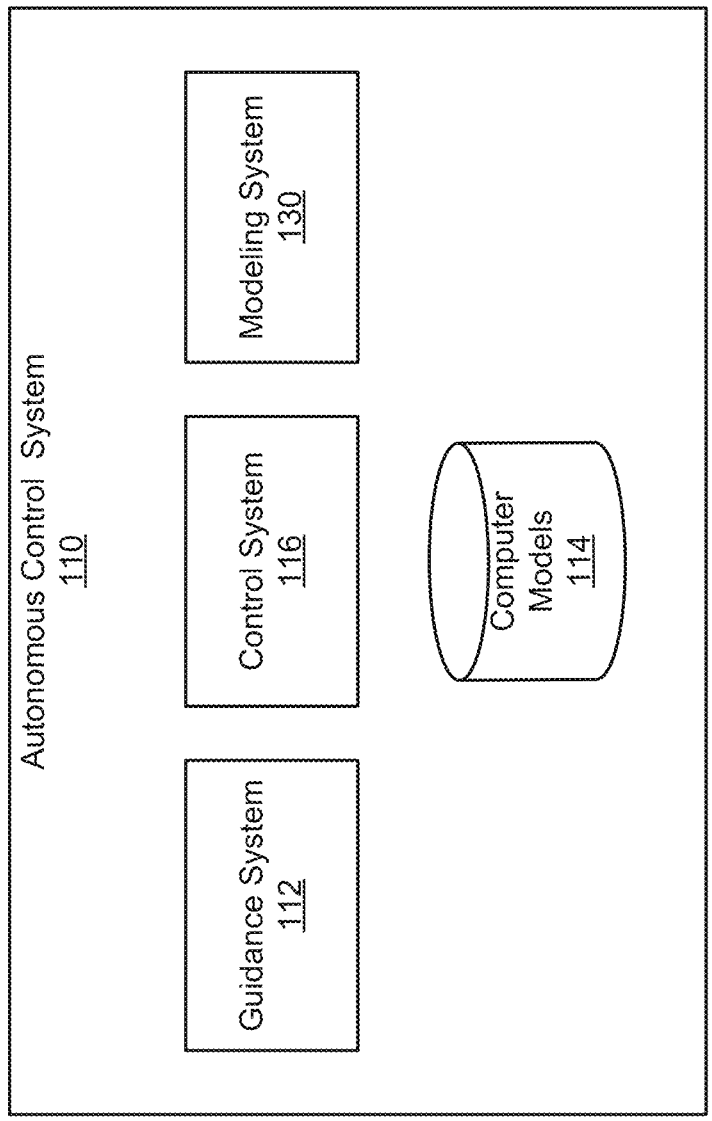
FIG. 1B is an example block diagram of an autonomous control system, according to another embodiment.

FIG. 1B is an example block diagram of an autonomous control system, according to another embodiment. In the embodiment shown in FIG. 1B, the modeling system 130 is included within the autonomous control system 110 of the vehicle. Thus, different from the embodiment shown in FIG. 1A, the computer models 114 may be trained locally on the vehicle instead of being provided to the autonomous control system 110 across a network 120.

Modeling System

Figure 4:
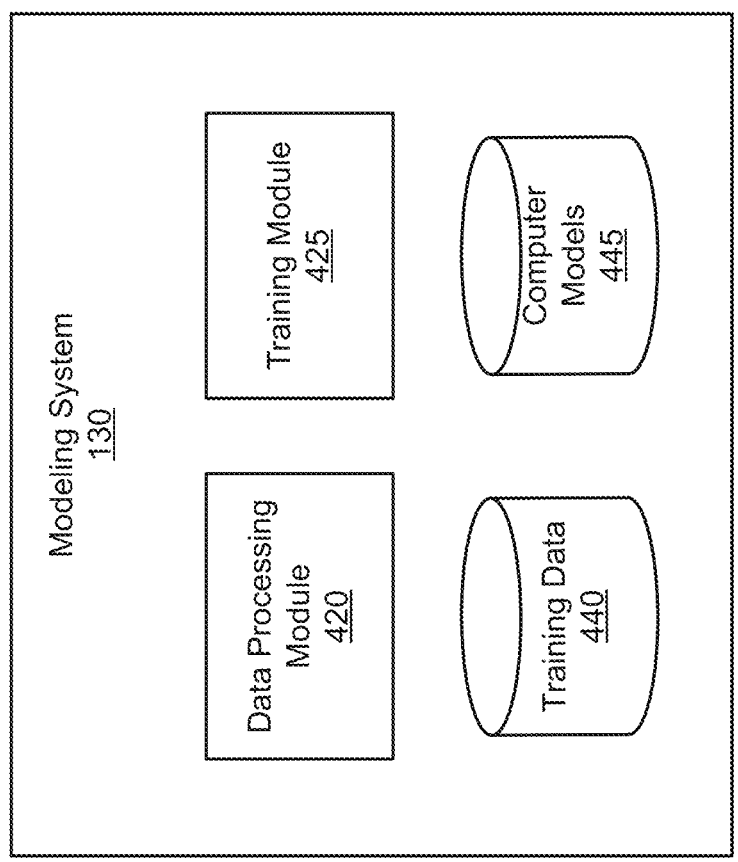
FIG. 4 is an example block diagram of an architecture of the modeling system, according to one embodiment.

FIG. 4 is an example block diagram of an architecture of the modeling system 130, according to one embodiment. The modeling system 130 of FIG. 4 includes a data processing module 420 and a training module 425. The modeling system 130 also includes a database of training data 440 and a database of computer models 445.

The data processing module 420 manages training data 440 for training the computer models 445. In one embodiment, the training data T for the object detection model includes n images $x_i$, i=1, 2, . . . , n from a set of computer simulated vehicles and known metadata $m_i$, i=1, 2, . . . , n for each image. The set of metadata $m_{i \in T}$ includes a collection of desired information about the corresponding vehicle in image $x_i$. In one embodiment, the metadata $m_i$ is represented as a vector in which different types of metadata are concatenated with each other in the vector.

In one instance, the metadata includes coordinates for a 3-D bounding box delineating the boundaries of the vehicle in the image $x_i$. For example, the 3-D bounding box can be represented as a series of coordinates of each corner of the bounding box in the image. In one instance, the data processing module 420 automatically determines the coordinates of the 3-D bounding box for each training image $x_i$, based on the known geometric information of the vehicle, without the need for a separate human operator to annotate the bounding box around the vehicle. For example, when the training image $x_i$ is an image of a CAD vehicle model, the data processing system 420 may determine the 3-D bounding box based on the geometric information contained in the CAD file of the vehicle model.

In one instance, the metadata includes orientation of the vehicle in the image $x_i$. The orientation may be defined as the displacement of the vehicle relative to a reference axis. For example, the orientation may be represented as the angular displacement of the vehicle relative to an axis along the length of the vehicle.

In one instance, the metadata includes the type of the vehicle in the image $x_i$. The vehicle type may be defined with respect to a set of classifications of the vehicle based on the structure and functionality of the vehicle. For example, the vehicle type may indicate whether the vehicle is a convertible, a truck, a van, a sedan, a SUV, and the like. The data processing module 420 may represent the vehicle type as a one-hot encoded vector in which each element corresponds to a different type, and only the element corresponding to the type of vehicle in the image $x_i$ has a non-zero value. In another instance, the vehicle type may be defined with respect to a set of classifications of the vehicle based on the manufacturer and model of the vehicle. Similarly, the data processing module may represent the vehicle type as a one-hot encoded vector in which each element corresponds to a specific model of a manufacturer, and only the element corresponding to the model of the vehicle in the image $x_i$ has a non-zero value.

In one embodiment, the training data S for the transformation model includes a set of reference images $r_i$, i=1, 2, . . . , m that are images of the computer simulated vehicles if a virtual sensor were present to capture the vehicles from a reference viewpoint. The training data S also includes a set of target images $t_i$, i=1, 2, . . . , m that are images of the same computer simulated vehicles if a virtual sensor were present to capture the vehicles from a target viewpoint.

When the transformation model is further configured to receive the label indicating a desired target viewpoint, the training data S' for the transformation model includes the set of reference images $r_i$, i=1, 2, . . . , m, a set of labels $l_i$, i=1, 2, . . . , m indicating target viewpoints, and a set of target images $t_i$, i=1, 2, . . . , m. Specifically, the target image $t_i$ contains an image of the computer simulated vehicle i taken from the target viewpoint indicated in label 4.

In one instance, the label $l_i$ indicating a target viewpoint for image $t_i$ can be represented as coordinates of a virtual camera with respect to a reference point if the virtual camera were to capture the vehicle shown in the target image $t_i$. In another instance, the label $l_i$ can represent one or more categories of viewpoints around the vehicle shown in the target image $t_i$. For example, the label $l_i$ can represent one among a frontal view, a rear view, a left side view, a right side view of the vehicle. Thus, when the reference viewpoint is a side view of a vehicle, an example training instance $\{r_1, l_1 = \text{"rear view,"} t_1\}$ may include a reference image $r_i$ containing a side view of a computer simulated vehicle and a target image $t_i$ containing a rear view of the corresponding vehicle as indicated in the label $l_1$.

The training module 425 trains the computer models 114 using the database of training data 440. The trained computer models are stored in database 445. The training module 425 may provide the trained models to the autonomous control system 110 for use.

In one embodiment, the object detection model is configured as a neural network architecture including a plurality of layers of nodes. The training module 425 trains a set of parameters of the object detection model to reduce a loss function based on the training dataset T. The loss function indicates a difference between the metadata $m_{i \in T}$ of the training dataset T and estimated metadata generated by applying the object detection model to the training images $x_{i \in T}$ of the dataset T. In one embodiment, the loss function for the object detection model is given by:

$$L_t(m_{i \in T}, m'_{i \in T}; \theta_t) = \sum_{i \in T} \|m_{i \in T} - m'_{i \in T}\|_2^2$$

where $\theta_t$ is the set of parameters of the object detection model, and $m'_{i \in T}$ denotes the estimated metadata generated by applying the object detection model to the training images $x_{i \in T}$.

Figure 5:
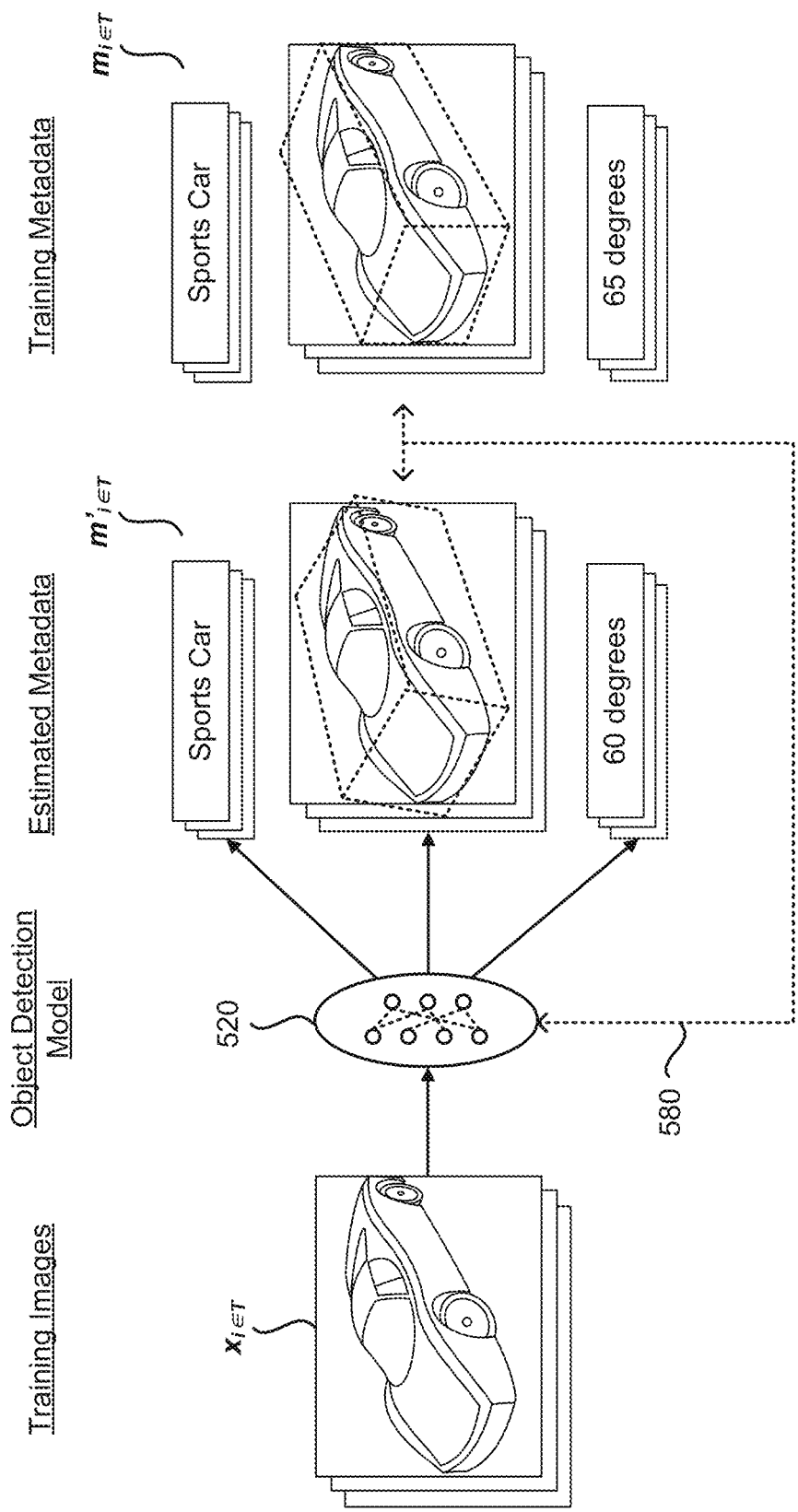
FIG. 5 illustrates an example process for training the object detection model, according to one embodiment.

FIG. 5 illustrates an example process for training the object detection model, according to one embodiment. Specifically, the training module 425 trains the set of parameters $\theta_t$ for the object detection model by repeatedly iterating between a forward pass step and a backpropagation step. During the forward pass step, the training module 425 generates the set of estimated metadata $m'_{i \in T}$ by applying the object detection model 520 with an estimated set of parameters to the set of training images $x'_{i \in T}$. In the example shown in FIG. 5, the estimated metadata $m'_1$ for the first training image $x_1$ includes an estimated vehicle type of "sports car," an estimated 3-D bounding box around the vehicle, and an estimated orientation of 60 degrees.

The training module 425 determines the loss function 580 based on a difference between the estimated metadata $m'_{i \in T}$ and the metadata $m_{i \in T}$ of the training dataset T. In the example shown in FIG. 5, the loss function for the first training instance is determined based on a difference between the estimated metadata $m'_1$ and the known metadata $m_1$ of the training dataset T. Specifically, the metadata $m_1$ for the first training image $x_1$ indicates a vehicle type of "sports car," the 3-D bounding box around the vehicle obtained from the geometric information of the vehicle model, and a known orientation of the vehicle of 65 degrees. During the backpropagation step, the training module 425 updates the set of parameters $\theta_t$ for the object detection model to reduce the loss function.

In one embodiment, the transformation model is configured as a neural network architecture including a plurality of layers of nodes. The training module 425 trains a set of parameters of the transformation model to reduce a loss function based on the training dataset S. The loss function indicates a difference between the target images $t_{i \in S}$ of the training dataset S and predicted target images $t'_{i \in S}$ generated by applying the transformation model to the reference images $r_{i \in S}$ of the training dataset S. In one embodiment, the loss function for the object detection model is given by:

$$L_s(t_{i \in S}, t'_{i \in S}; \theta_s) = \sum_{i \in S} \|t_{i \in S} - t'_{i \in S}\|_2^2$$

where $\theta_s$ is the set of parameters of the transformation model, and $t'_{i \in S}$ denotes the predicted target images generated by applying the transformation model to the reference images $r_{i \in S}$.

Figure 6:
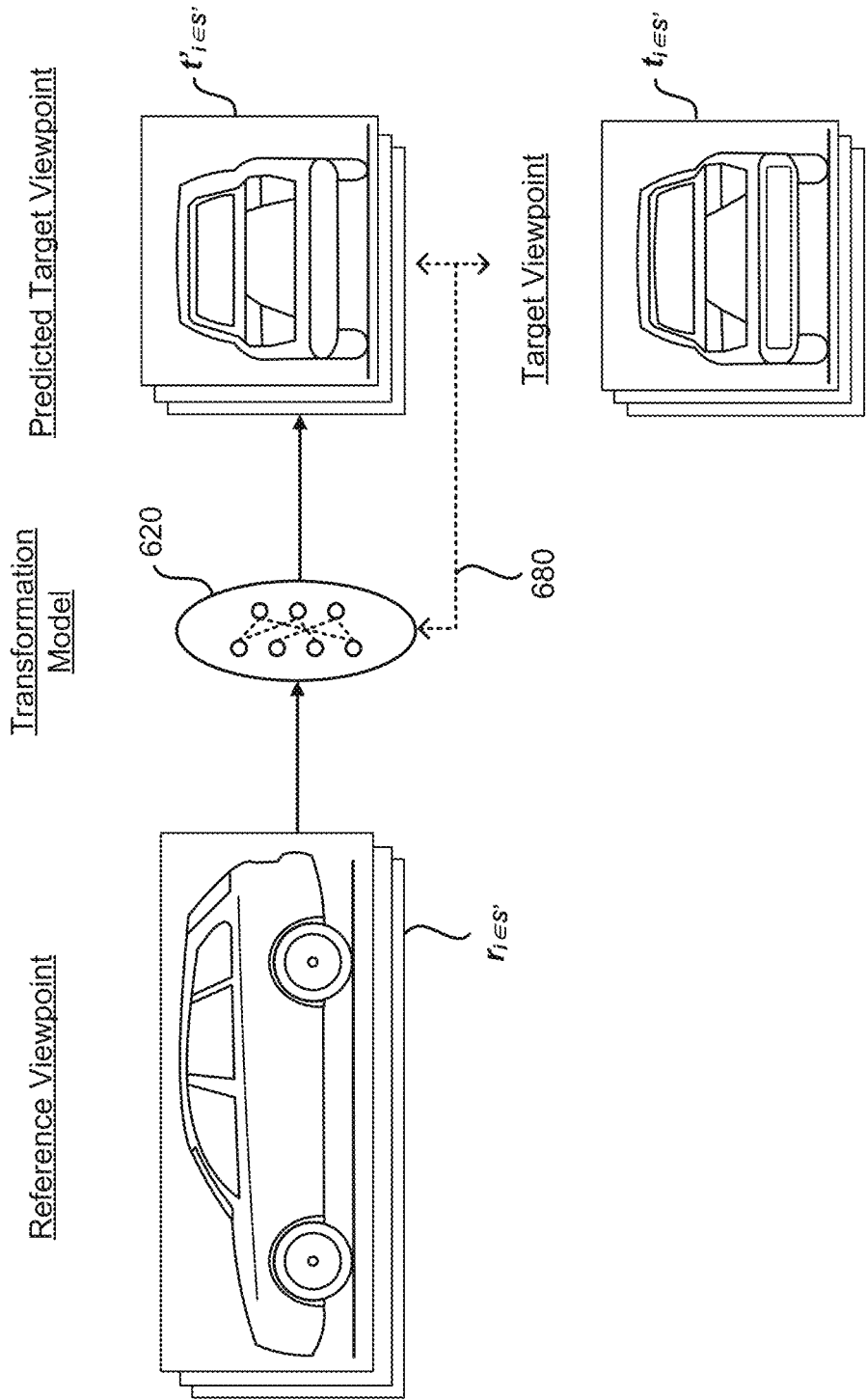
FIG. 6 illustrates an example process for training the transformation model, according to one embodiment.

FIG. 6 illustrates an example process for training the transformation model, according to one embodiment. Specifically, the training module 425 trains the set of parameters $\theta_s$ for the transformation model by repeatedly iterating between a forward pass step and a backpropagation step. During the forward pass step, the training module 425 generates the set of predicted target images $t'_{i \in S}$ by applying the transformation model 620 with an estimated set of parameters to the set of reference images $r_{i \in S}$. In the example shown in FIG. 6, the reference image $r_1$ for the first training instance includes a side view of a CAD SUV vehicle, and the predicted target image $t_1$ for the corresponding vehicle includes a predicted rear view of the SUV vehicle.

The training module 425 determines the loss function 680 based on a difference between the estimated target images $t'_{i \in S}$ and the target images $t_{i \in S}$ of the training dataset S. In the example shown in FIG. 6, the loss function for the first training instance is determined based on a difference between the predicted target image $t'_1$ and the target image $t_1$ of the training dataset S. Specifically, the target image $t_1$ for the first training instance is an image of the rear view of the CAD vehicle model in the reference image $r_1$. During the backpropagation step, the training module 425 updates the set of parameters $\theta_s$ for the transformation model to reduce the loss function.

In another embodiment, the training module 425 trains a set of parameters for a transformation model further configured to receive a label indicating a desired target viewpoint based on the training dataset S'. The training process is similar to that of the previous embodiment shown in FIG. 6, except that the set of predicted target images Vies, are generated by applying the transformation model with an estimated set of parameters to the set of reference images $r'_{i \in S'}$ and the corresponding labels $l'_{i \in S'}$ in the training dataset S'.

Figure 7:
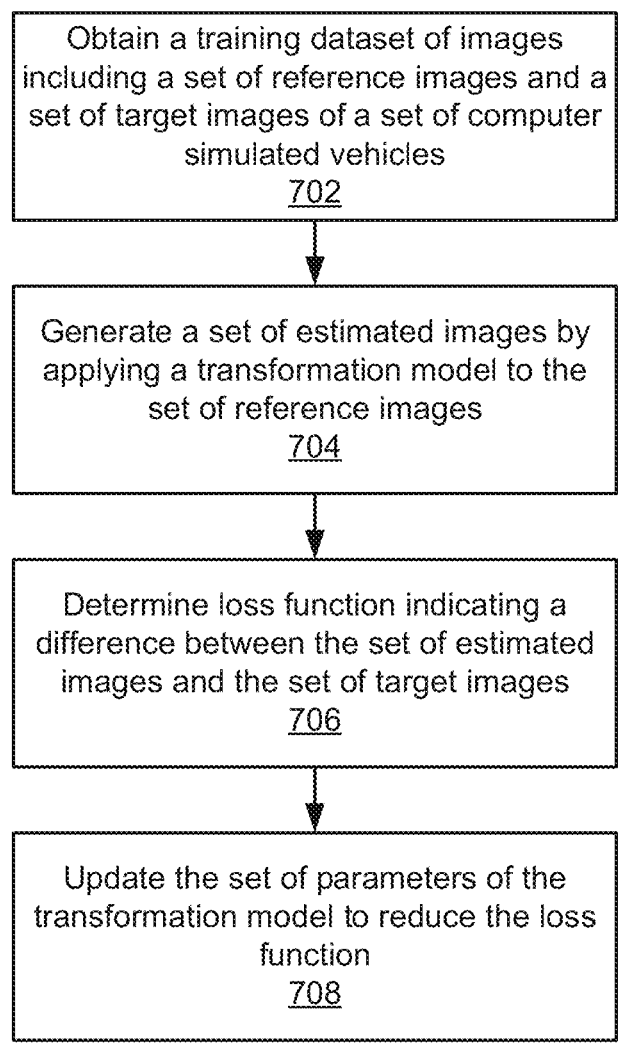
FIG. 7 is a flowchart illustrating a training process for a transformation model, according to one embodiment.

FIG. 7 is a flowchart illustrating a training process for a transformation model, according to one embodiment. The modeling system obtains 702 a training dataset of images that represent a set of computer simulated vehicles with known characteristics. The training dataset includes a set of reference images that capture the computer simulated vehicles from a reference viewpoint, and a set of target images that capture the computer simulated vehicles from a target viewpoint. The modeling system trains a set of parameters for the object detection model. Specifically, the modeling system generates 704 a set of estimated images by applying the transformation model with an estimated set of parameters to the set of reference images. The modeling system determines 706 a loss function indicating a difference between the set of estimated images and the set of target images. The modeling system updates 708 the set of parameters of the transformation model to reduce the loss function.

Figure 8:
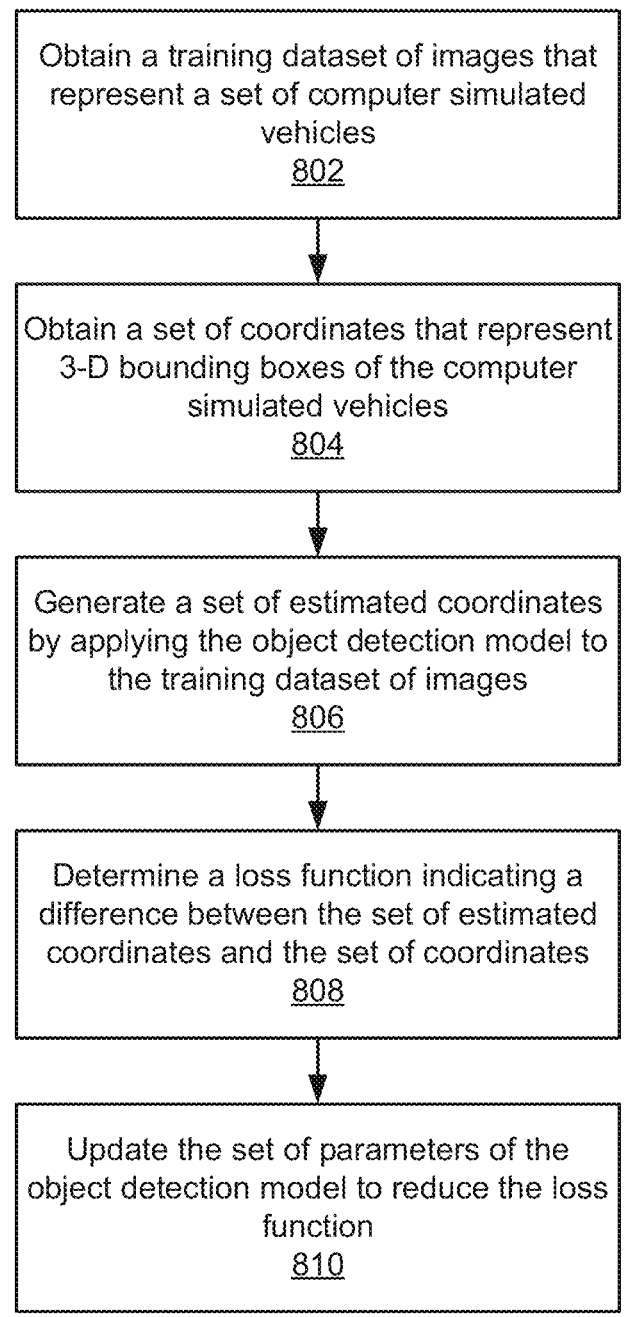
FIG. 8 is a flowchart illustrating a training process for an object detection model, according to one embodiment.

FIG. 8 is a flowchart illustrating a training process for an object detection model, according to one embodiment. The modeling system obtains 802 a training dataset of images that represent a set of computer simulated vehicles with known characteristics. The modeling system obtains 804 a set of coordinates for the images that represent 3-D bounding boxes of the computer simulated vehicles. The 3-D bounding boxes enclose an outer boundary of the computer simulated vehicles and is determined based on the geometric information of the vehicles. The modeling system trains a set of parameters of the object detection model using the training dataset of images. Specifically, the modeling system generates 806 a set of estimated coordinates by applying the object detection model with an estimated set of parameters to the training dataset of images. The modeling system determines 808 a loss function indicating a difference between the set of estimated coordinates and the set of coordinates for the computer simulated vehicles. The modeling system updates 810 the set of parameters for the object detection model to reduce the loss function.

Hardware Components

Figure 9:
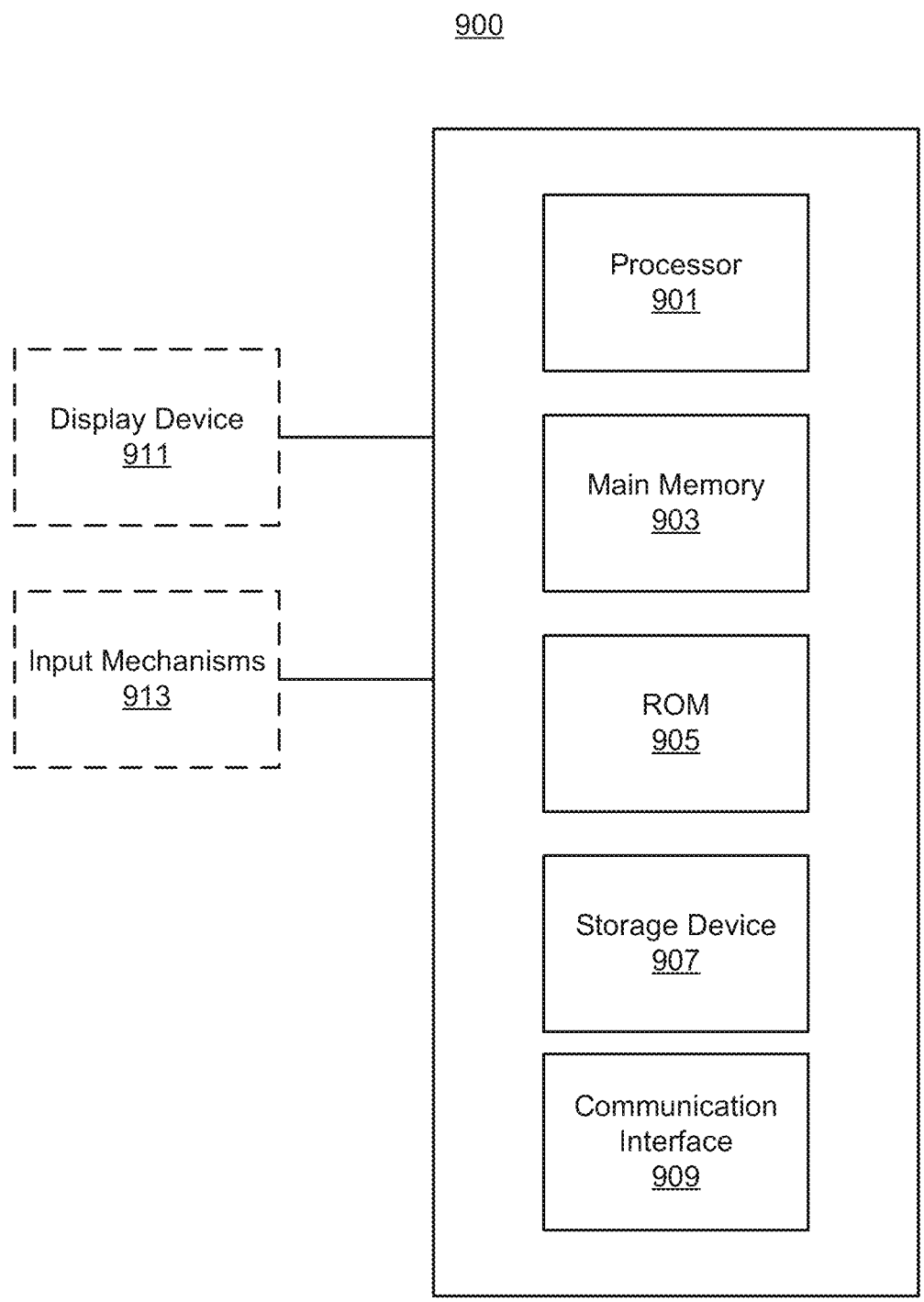
FIG. 9 is a diagram illustrating a computer system upon which embodiments described herein may be implemented within the autonomous control system and the modeling system, according to one embodiment.

FIG. 9 is a diagram illustrating a computer system 900 upon which embodiments described herein may be implemented within the autonomous control system 110 and the modeling system 130. For example, in the context of FIGS. 1A and 1B, the autonomous control system 110 and its sub-systems, such as the guidance system 112 and the control system 116, may be implemented using a computer system such as described by FIG. 9. The autonomous control system 110 and its sub-systems may also be implemented using a combination of multiple computer systems as described by FIG. 9. As another example, in the context of FIG. 4, the modeling system 130 and its modules, such as the data processing module 420 and the training module 425, may be implemented using a computer system such as described by FIG. 9. The modeling system 130 and its modules may also be implemented using a combination of multiple computer systems as described by FIG. 9.

In one implementation, the computer system 900 includes processing resources 901, main memory 903, read only memory (ROM) 905, storage device 907, and a communication interface 909. The computer system 900 includes at least one processor 901 for processing information and a main memory 903, such as a random access memory (RAM) or other dynamic storage device, for storing information and instructions to be executed by the processor 901. Main memory 903 also may be used for storing temporary variables or other intermediate information during execution of instructions to be executed by processor 901. The computer system 900 may also include ROM 905 or other static storage device for storing static information and instructions for processor 901. The storage device 907, such as a magnetic disk or optical disk or solid state memory device, is provided for storing information and instructions. For example in the context of FIGS. 1A and 1B, the computer models store 114 of the autonomous control system 110 may be stored in the read only memory (ROM) 905 or the storage device 907. As another example, in the context of FIG. 4, the training data store 440 and the computer models data store 445 of the modeling system 130 may be stored in the read only memory (ROM) 905 or the storage device 907.

The communication interface 909 can enable the modeling system 130 and the autonomous control system 110 to communicate with each other through use of a communication link (wireless or wireline). Using the communication link, the modeling system 130 can communicate with the different sub-systems included in the autonomous control system 110 to enable autonomous operation of a vehicle. In some variations, the modeling system 130 can be configured to receive sensor data (e.g., such as GPS data) from one or more location tracking devices in the computer system 900. The sensor data can be processed by the processor 901 and can be stored in, for example, the storage device 907. The processor 901 can process the sensor data of a location tracking device in order to determine the location and trajectory of a vehicle.

The computer system 900 can optionally include a display device 911, such as a cathode ray tube (CRT), an LCD monitor, an LED monitor, a TFT display or a television set, for example, for displaying graphics and information to a user. An input mechanism 913, such as a keyboard that includes alphanumeric keys and other keys, can optionally be coupled to the computer system 900 for communicating information and command selections to processor 901. Other non-limiting, illustrative examples of input mechanisms 913 include a mouse, a trackball, touch-sensitive screen, or cursor direction keys for communicating direction information and command selections to processor 901 and for controlling cursor movement on display device 911.

Examples described herein are related to the use of the modeling system 130 and/or the autonomous control system 110 for implementing the techniques described herein. According to one embodiment, those techniques are performed by the modeling system 130 and/or the autonomous control system 110 in response to processor 901 executing one or more sequences of one or more instructions contained in main memory 903. Such instructions may be read into main memory 903 from another machine-readable medium, such as storage device 907. Execution of the sequences of instructions contained in main memory 903 causes processor 901 to perform the process steps described herein. In alternative implementations, hard-wired circuitry may be used in place of or in combination with software instructions to implement examples described herein. Thus, the examples described are not limited to any specific combination of hardware circuitry and software.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer-implemented method of training a machine-learned transformation model configured to receive an image of a vehicle from a reference viewpoint and output a target image of the vehicle from a target viewpoint different from the reference viewpoint, comprising:
    obtaining a training dataset of images that represent a set of computer simulated vehicles with a known set of characteristics, the training dataset of images including a training set of reference images that capture the computer simulated vehicles from one or more reference viewpoints and a corresponding training set of target images that capture the computer simulated vehicles from one or more target viewpoints different from the one or more reference viewpoints; and
    training a set of parameters of the transformation model using the training dataset of images, the training comprising repeatedly performing iterations of:
        generating a set of estimated target images by applying the transformation model with an estimated set of parameters to the training set of reference images,
        determining a loss function indicating a difference between the set of estimated target images and the training set of target images, and
        updating the set of parameters of the transformation model to reduce the loss function.

2. The computer-implemented method of claim 1, wherein the set of computer simulated vehicles are computer-aided design (CAD) generated models of vehicles, or computer simulated light detection and range (LIDAR) models of vehicles.

3. The computer-implemented method of claim 1, further comprising:
    obtaining a new image of a second vehicle in a scene and a desired target viewpoint of the second vehicle;
    generating a predicted target image by applying the transformation model to a region of the new image containing the vehicle, the predicted target image predicting appearance of the second vehicle from the desired target viewpoint; and
    determining whether the second vehicle is present in the region of the new image using the predicted target image.

4. The computer-implemented method of claim 1, wherein the transformation model is further configured to receive a label indicating a desired target viewpoint, wherein the training dataset of images further includes a training set of labels indicating the one or more target viewpoints of the training set of target images, and wherein generating the set of estimated target images further comprises applying the transformation model with the estimated set of parameters to the training set of labels.

5. The computer-implemented method of claim 4, wherein a label in the training set of labels is represented as a set of coordinates or a set of categories of viewpoints.

6. The computer-implemented method of claim 1, wherein the one or more reference viewpoints are viewpoints showing side parts of the computer simulated vehicles.

7. A non-transitory computer-readable storage medium storing computer program instructions executable to perform operations for training a machine-learned transformation model configured to receive an image of a vehicle from a reference viewpoint and output a target image of the vehicle from a target viewpoint different from the reference viewpoint, the operations comprising:
    obtaining a training dataset of images that represent a set of computer simulated vehicles with a known set of characteristics, the training dataset of images including a training set of reference images that capture the computer simulated vehicles from one or more reference viewpoints and a corresponding training set of target images that capture the computer simulated vehicles from one or more target viewpoints different from the one or more reference viewpoints; and
    training a set of parameters of the transformation model using the training dataset of images, the training comprising repeatedly performing iterations of:
        generating a set of estimated target images by applying the transformation model with an estimated set of parameters to the training set of reference images,
        determining a loss function indicating a difference between the set of estimated target images and the training set of target images, and
        updating the set of parameters of the transformation model to reduce the loss function.

8. The computer-readable storage medium of claim 7, wherein the set of computer simulated vehicles are computer-aided design (CAD) generated models of vehicles, or computer simulated light detection and range (LIDAR) models of vehicles.

9. The computer-readable storage medium of claim 7, the instructions further comprising:
    obtaining a new image of a second vehicle in a scene and a desired target viewpoint of the vehicle;
    generating a predicted target image by applying the transformation model to a region of the new image containing the vehicle, the predicted target image predicting appearance of the second vehicle from the desired target viewpoint; and
    determining whether the second vehicle is present in the region of the new image using the predicted target image.

10. The computer-readable storage medium of claim 7, wherein the transformation model is further configured to receive a label indicating a desired target viewpoint, wherein the training dataset of images further includes a training set of labels indicating the one or more target viewpoints of the training set of target images, and wherein generating the set of estimated target images further comprises applying the transformation model with the estimated set of parameters to the training set of labels.

11. The computer-readable storage medium of claim 10, wherein a label in the training set of labels is represented as a set of coordinates or a set of categories of viewpoints.

12. The computer-readable storage medium of claim 7, wherein the one or more reference viewpoints are viewpoints showing side parts of the computer simulated vehicles.

13. An autonomous control vehicle including a machine-learned transformation model stored on a computer-readable medium manufactured by the process of:
   obtaining a training dataset of images that represent a set of computer simulated vehicles with a known set of characteristics, the training dataset of images including a training set of reference images that capture the computer simulated vehicles from one or more reference viewpoints and a corresponding training set of target images that capture the computer simulated vehicles from one or more target viewpoints different from the one or more reference viewpoints; and
   training a set of parameters of the transformation model using the training dataset of images, the training comprising repeatedly performing iterations of:
      generating a set of estimated target images by applying the transformation model with an estimated set of parameters to the training set of reference images,
      determining a loss function indicating a difference between the set of estimated target images and the training set of target images, and
      updating the set of parameters of the transformation model to reduce the loss function.

14. The autonomous control vehicle of claim 13, wherein the set of computer simulated vehicles are computer-aided design (CAD) generated models of vehicles, or computer simulated light detection and range (LIDAR) models of vehicles.

15. The autonomous control vehicle of claim 13, further comprising:
   obtaining a new image of a second vehicle in a scene and a desired target viewpoint of the vehicle;
   generating a predicted target image by applying the transformation model to a region of the new image containing the vehicle, the predicted target image predicting appearance of the second vehicle from the desired target viewpoint; and
   determining whether the second vehicle is present in the region of the new image using the predicted target image.

16. The autonomous control vehicle of claim 13, wherein the transformation model is further configured to receive a label indicating a desired target viewpoint, wherein the training dataset of images further includes a training set of labels indicating the one or more target viewpoints of the training set of target images, and wherein generating the set of estimated target images further comprises applying the transformation model with the estimated set of parameters to the training set of labels.

17. The autonomous control vehicle of claim 16, wherein a label in the training set of labels is represented as a set of coordinates or a set of categories of viewpoints.

18. The autonomous control vehicle of claim 13, wherein the one or more reference viewpoints are viewpoints showing side parts of the computer simulated vehicles.

* * * * *